US011881673B2

(12) United States Patent
Cogliati et al.

(10) Patent No.: US 11,881,673 B2
(45) Date of Patent: Jan. 23, 2024

(54) ELECTRICAL COVER FOR WIRED DEVICES

(71) Applicant: AMTROL Licensing Inc., West Warwick, RI (US)

(72) Inventors: Michael Cogliati, Boonton, NJ (US); Brady R. Erickson, North Providence, RI (US); Jeffrey Neto, Cumberland, RI (US)

(73) Assignee: AMTROL LICENSING INC., West Warwick, RI (US)

( * ) Notice: Subject to any disclaimer, the term of this patent is extended or adjusted under 35 U.S.C. 154(b) by 359 days.

(21) Appl. No.: 17/179,665

(22) Filed: Feb. 19, 2021

(65) Prior Publication Data
US 2021/0273354 A1 Sep. 2, 2021

Related U.S. Application Data

(60) Provisional application No. 62/982,162, filed on Feb. 27, 2020.

(51) Int. Cl.
| | | |
|---|---|---|
| *H01R 9/24* | (2006.01) | |
| *F04B 23/02* | (2006.01) | |
| *F04B 47/00* | (2006.01) | |
| *F04B 49/06* | (2006.01) | |
| *H05K 5/00* | (2006.01) | |
| *H05K 5/02* | (2006.01) | |

(52) U.S. Cl.
CPC .......... *H01R 9/2416* (2013.01); *F04B 23/02* (2013.01); *F04B 47/00* (2013.01); *F04B 49/06* (2013.01); *H05K 5/0004* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 2,740,001 | A | | 3/1956 | Vergilio |
| 5,139,440 | A | * | 8/1992 | Volk .................... H01R 4/2433 439/402 |
| 5,186,661 | A | * | 2/1993 | Capper ................ B65D 43/164 439/718 |
| 5,528,684 | A | | 6/1996 | Schneider |
| 5,588,874 | A | * | 12/1996 | Pruehs .................... H02B 1/03 439/146 |
| 5,837,938 | A | * | 11/1998 | Sakamoto .............. H01R 9/223 220/241 |
| 5,944,561 | A | * | 8/1999 | McCleerey .............. H02B 3/14 439/718 |
| 5,959,250 | A | * | 9/1999 | Daoud ................... H02G 3/088 174/650 |

(Continued)

OTHER PUBLICATIONS

PCT/US2020/018682; International Search Report and Written Opinion of the International Searching Authority dated May 11, 2021; 30 Pages.

*Primary Examiner* — Xanthia C Relford
(74) *Attorney, Agent, or Firm* — TUCKER ELLIS LLP

(57) ABSTRACT

An electrical cover for a terminal block of a device is provided that protects the terminal block from risks associated with stray wires. The electrical cover retains desired wiring in a connection space of the terminal block while also guarding against other stray wiring from entering the connection space.

18 Claims, 9 Drawing Sheets

(56) References Cited

U.S. PATENT DOCUMENTS

| | | | | |
|---|---|---|---|---|
| 6,039,613 | A * | 3/2000 | Bullard | H01R 9/2416 |
| | | | | 439/718 |
| 6,172,302 | B1 * | 1/2001 | Kasai | B60R 16/0215 |
| | | | | 174/67 |
| 6,266,232 | B1 * | 7/2001 | Rose | H02B 1/056 |
| | | | | 361/627 |
| 6,402,568 | B1 * | 6/2002 | Nagai | H01R 13/514 |
| | | | | 439/701 |
| 6,404,652 | B1 * | 6/2002 | Takebayashi | H01R 9/2408 |
| | | | | 439/713 |
| 6,638,115 | B2 * | 10/2003 | Mochizuki | H01R 13/506 |
| | | | | 439/701 |
| 6,736,650 | B1 * | 5/2004 | Chen | H01R 13/4368 |
| | | | | 439/713 |
| 7,960,650 | B2 * | 6/2011 | Richter | H02S 40/345 |
| | | | | 174/64 |
| 8,016,622 | B2 * | 9/2011 | Battle | H01R 4/2408 |
| | | | | 439/798 |
| 2003/0146016 | A1 * | 8/2003 | Johnson | H01R 13/447 |
| | | | | 174/138 F |
| 2007/0270045 | A1 * | 11/2007 | Korczynski | H01H 50/048 |
| | | | | 361/58 |
| 2008/0113262 | A1 * | 5/2008 | Phillips | H01M 10/482 |
| | | | | 429/149 |
| 2009/0272574 | A1 * | 11/2009 | Richter | H01R 13/5202 |
| | | | | 174/548 |
| 2017/0334375 | A1 * | 11/2017 | Shigyo | H01R 24/76 |
| 2020/0006869 | A1 * | 1/2020 | Newman | H01R 13/582 |

\* cited by examiner

ELECTRICAL COVER FOR WIRED DEVICES

CROSS-REFERENCE TO RELATED APPLICATIONS

This application claims the benefit of and priority to U.S. Provisional Application No. 62/982,162, filed on Feb. 27, 2020. The entirety of this application is herein incorporated by reference.

TECHNICAL FIELD

This application relates generally to an electrical cover for wired devices and, more particularly, to an electrical cover for terminal blocks.

BACKGROUND

A terminal block may connect to high voltage power (e.g. such as line power) greater than or equal to 120 volts. The terminal block may be associated with a controller or other electronic device that is powered by the high voltage power. The terminal block may have a metal area to which high voltage wiring can be fastened. A screw-type fastener is often used, for instance.

BRIEF SUMMARY OF THE INVENTION

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of the summary is to present some concepts related to some exemplary non-limiting embodiments in a simplified form as a prelude to the more detailed description of the various embodiments that follow.

In various, non-limiting embodiments, an electrical cover for a terminal block of a device is provided that protects the terminal block from risks associated with stray wires. The electrical cover retains desired wiring in a connection space of the terminal block while also guarding against other stray wiring from entering the connection space.

These and other embodiments are described in more detail below.

BRIEF DESCRIPTION OF THE DRAWING

Various non-limiting embodiments are further described with reference the accompanying drawings in which.

DETAILED DESCRIPTION OF THE INVENTION

A well system generally includes a water pump that draws water from a well to a plumbing system of a structure. A pressure tank is often utilized to provide water under pressure to the plumbing system to supplement the water pump and to allow the water pump to run intermittently. Even when the pump is capable of meeting demand, a continuously running pump may have a shorter operational lifetime.

A pressure switch enables the well pump to operate intermittently while also ensuring that the system maintains pressure. The pressure switch is a device that opens and closes an electrical contact based on a water pressure acting against an input of the pressure switch. The pressure switch is configured to close the electrical contact, and therefore activate the pump, when the pressure acting against the input falls to a predetermined cut-in pressure. Similarly, the pressure switch is configured to open the electrical contact (i.e. turn off the pump) when the pressure acting against the input rises to a predetermined cut-out pressure.

A pressure switch merely maintains a system pressure within a configured range and does not provide any pump protection. Such devices do not provide robust management, control, or protection of the well system. In addition, physical inspection of the well system (i.e. the pressure tank and/or pump) is required in order to ascertain a status and/or make system adjustments.

An improved well management system can include a controller capable of communicating with a backend system via a communication network and, through the backend system, communicate with one or more client devices.

Figure 1:
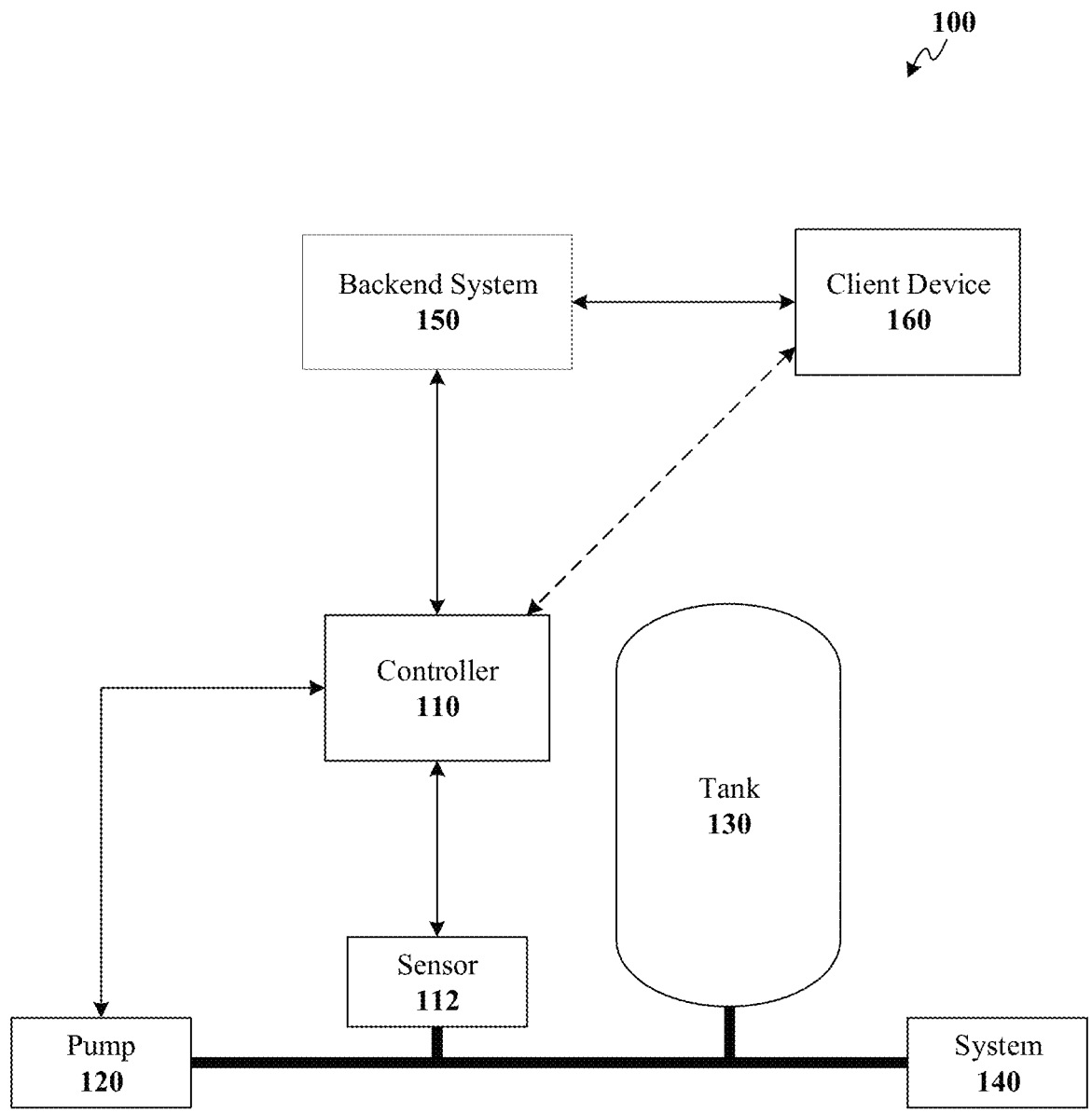
FIG. 1 is a schematic block diagram of an exemplary, non-limiting embodiment of a well management system according to one or more aspects.
Figure 2:
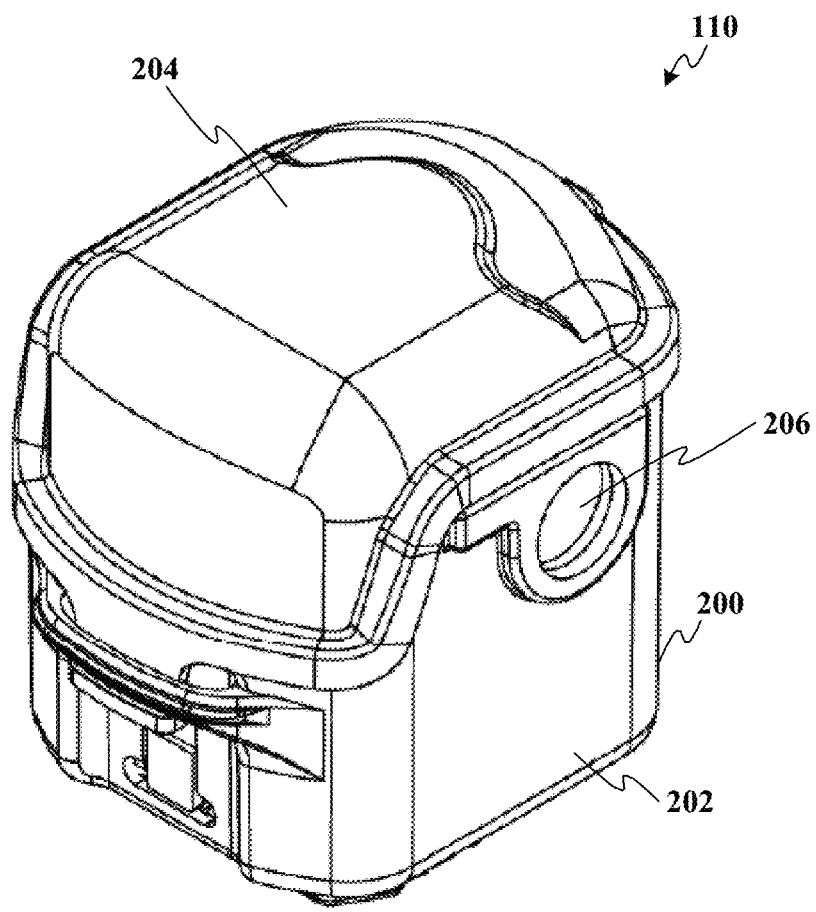
FIG. 2 is a top front right perspective view of an exemplary, non-limiting embodiment of a controller of the well management system of FIG. 1.
Figure 3:
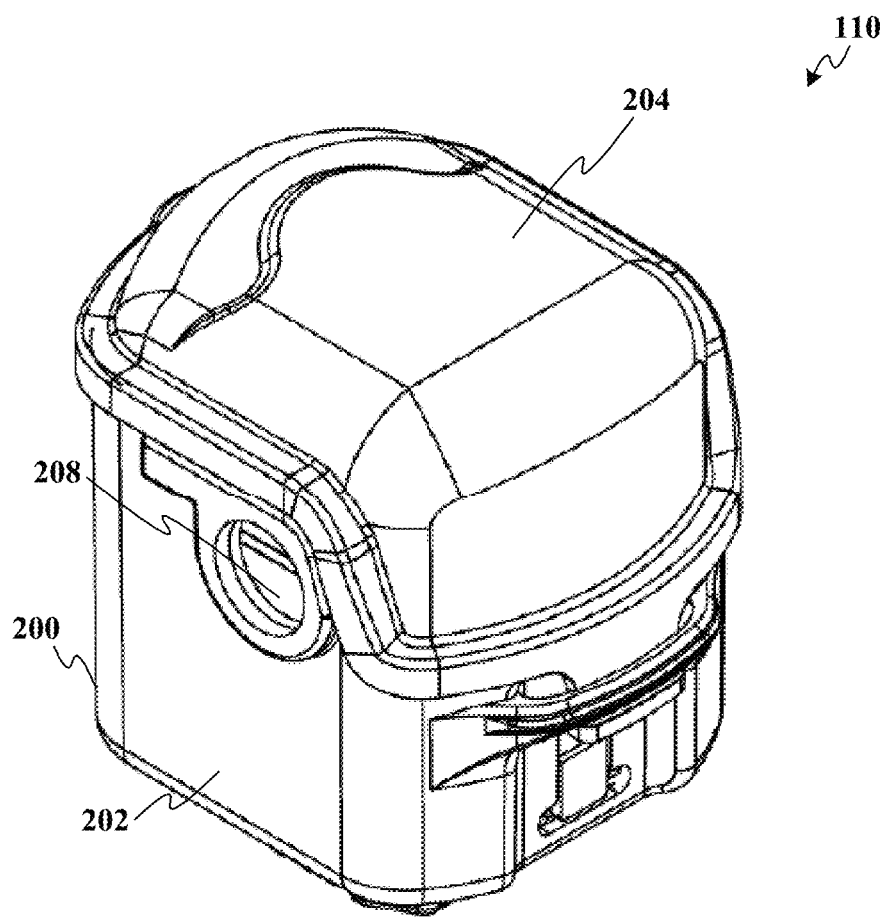
FIG. 3 is a top front left perspective view of the controller of FIG. 2.
Figure 4:
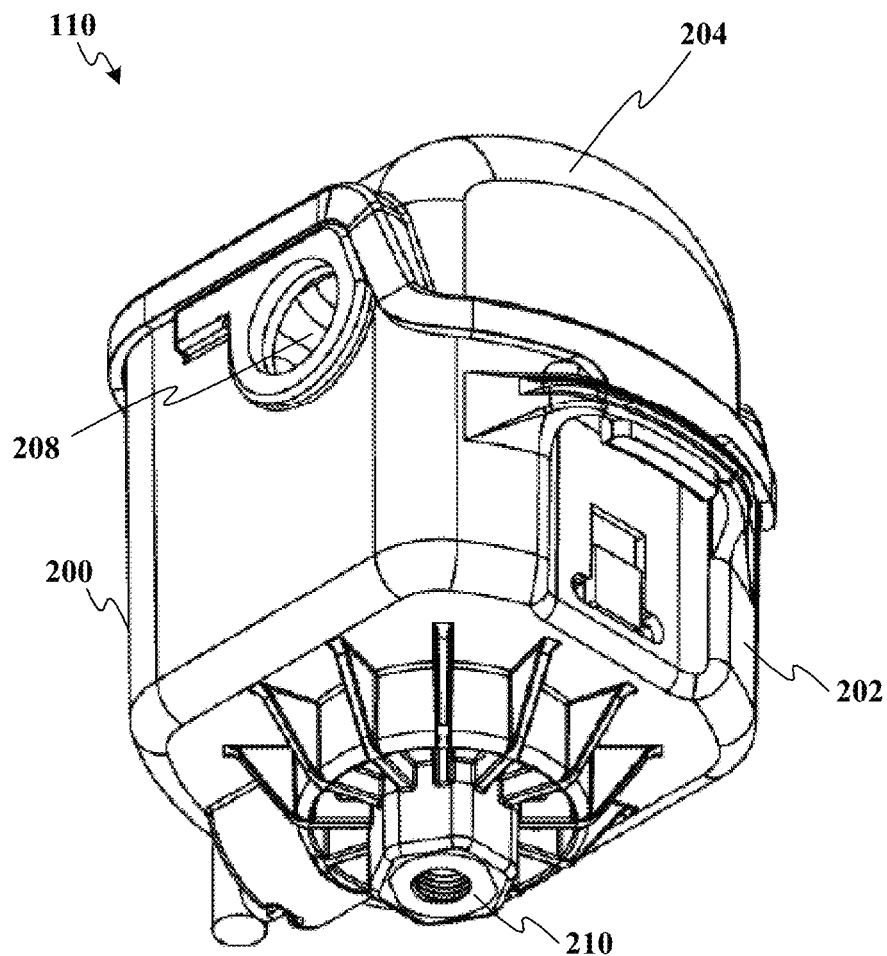
FIG. 4 is a bottom front left perspective view of the controller of FIG. 2.

FIG. 1 shows a schematic block diagram of an exemplary, non-limiting embodiment of an Internet-enabled well management system. System 100 can include a controller 110, which is operatively coupled to a pump 120 for moving a fluid from a well. The pump 120 provides the fluid to a pressure tank 130 and/or a distribution system 140 (e.g., a plumbing system of a structure). The tank 130 can be a pressure vessel having an internal diaphragm that separates an interior volume into an air chamber from a water chamber. The air chamber is provided with a pre-charge of air pressure to provide fluid under pressure to the distribution system 140 even when pump 120 is not running.

Controller 110 activates and deactivates pump 120 in accordance with an operating mode established for the system 100. More particularly, the controller 110 collects operational data related to various components of system 100 and operates pump 120 in accordance with the operational data and an operational configuration stored by the controller 110.

By way of example, the operational configuration can include pressure setpoints and the operational data can include pressure readings from a sensor 112. The sensor 112 can be coupled to fluid lines between pump 120 and tank 130 or distribution system 140. The sensor 112 provides a pressure reading in the fluid lines and communicates the pressure reading to controller 110. In accordance with a normal operating mode, controller 110 activates pump 120 when the pressure reading falls below a cut-in pressure and deactivates pump 120 when the pressure reading is at or above a cut-out pressure. Although depicted as being separate from controller 110, it is to be appreciated that sensor 112 can be integrated with controller 110. For instance, sensor 112 can be at least partially integrated with a circuit board of controller 110 and/or enclosed within a common housing. Moreover, the common housing that includes the controller 110 and/or sensor 112 may be installed on or attached to the tank 130.

Controller 110 can acquire operational data related to the pump 120. For instance, electrical properties (e.g., current, voltage, resistance) of pump 120 as well as cycle times can be recorded by the controller 110. Additional operational data can include a water level within tank 130, system output history, and/or data from other sensors (e.g., water usage sensors, temperature sensors, etc.). In addition, operational data can also include user input such as, but not limited to, images of a physical setup of system 100, maintenance notes, etc.

The operational configuration of controller 110 can include alarm conditions or event triggers. The controller 110 can respond with a pre-configured action when operational data acquired by controller 110 satisfies an alarm condition or event trigger. For instance, the controller 110 may deviate from a normal operating mode in response to the alarm condition or event trigger. The deviation can include shutting off the pump for a period of time and/or until the condition is resolved.

The controller 110 can also transmit a notification or alert message to inform a homeowner or service contractor of the system condition. To enable this action, controller 110 can be configured to communicate with a backend system 150 and/or a client device 160. The communication can be performed via a communications network or, in some instances, the communication can be a direct device-to-device communication.

According to an aspect, the backend system 150 can register one or more users with the controller 110. These users may utilize client devices 160 to communicate with controller 110 via the backend system 150 subject to configured access levels. For instance, a homeowner may have full access to all information. The homeowner can specify a service contractor and register the service contractor with the backend system 150. The level of information access granted to the service contractor is adjustably controlled by the homeowner.

The controller 110 can be polled for information by the backend system 150. Alternatively, the controller 110 can be configured to transmit information periodically. In one embodiment, the backend system 150 may operate as a relay between controller 110 and client device 160. For instance, the backend system 150 may forward information, transmitted by the controller 110, to the client device 160 and may forward commands and requests from the client device 160 to the controller 110. In another embodiment, operational data and other operational history information can be transmitted by the controller 110 to the backend system 150 for storage. The backend system 150 can provide, subject to access levels, the stored information to client device 160 independently of controller 110. It is to be appreciated that system 100 can operate along a continuum between the two approaches described above. For example, the controller 110 can retain certain information while the backend system 150 stores other information to allow efficient utilization of storage on controller 110.

In another aspect, controller 110 can utilize direct device-to-device communication. For instance, client device 160 may be in proximity (i.e. same structure, same room, etc.) as controller 110. In such cases, a wired or wireless connection (e.g. Bluetooth, wireless USB, ad-hoc WiFi, etc.) can be established between client device 160 and controller 110.

The operational configuration of controller 110 can specify one of a plurality of operating modes or states in which the controller 110 currently operates. As mentioned previously, the controller 110 utilizes pressure setpoints and a pressure reading to activate/deactivate pump 120 in a normal operating mode. When controller 110 is powered on for a first time, it may enter an initial startup mode. In the initial startup mode, the controller 110 can active pump 120 to fill tank 130, determine a pre-charge of the tank 130, and establish pressure settings based on the pre-charge. Those pressure settings can be subsequently be utilized in the normal operating mode.

Additional modes may include a setup mode, a vacation mode, a storm mode, and a maintenance mode. In the setup mode, the controller 110 may utilize direct device-to-device communication initially with client device 160 in order to register with and configure communications with backend system 150. In the vacation mode, the controller 110 is configured to prevent activation of pump 120. In the storm mode, the controller 110 overrides the pressure setpoints in order to maximize an amount of water stored in the tank 130. In maintenance mode, the controller 110 can recheck a charge of tank 130. This value can be compared with an initial reading to determine charge degradation. In this manner, maintenance mode provides a health status check of system 100. Further, maintenance view on client device 160 can provide health status information such as, but not limited to, the charge degradation, a current pre-charge reading, electrical inputs to pump 120, etc. Moreover, a protection mode is available for when controller 110 detects an alarm condition or other event that justifies deviation from the normal operating mode.

Additional aspects of the well management system can be found in U.S. patent application Ser. No. 16/046,441, the entirety of which is incorporated herein by reference.

Figure 5:
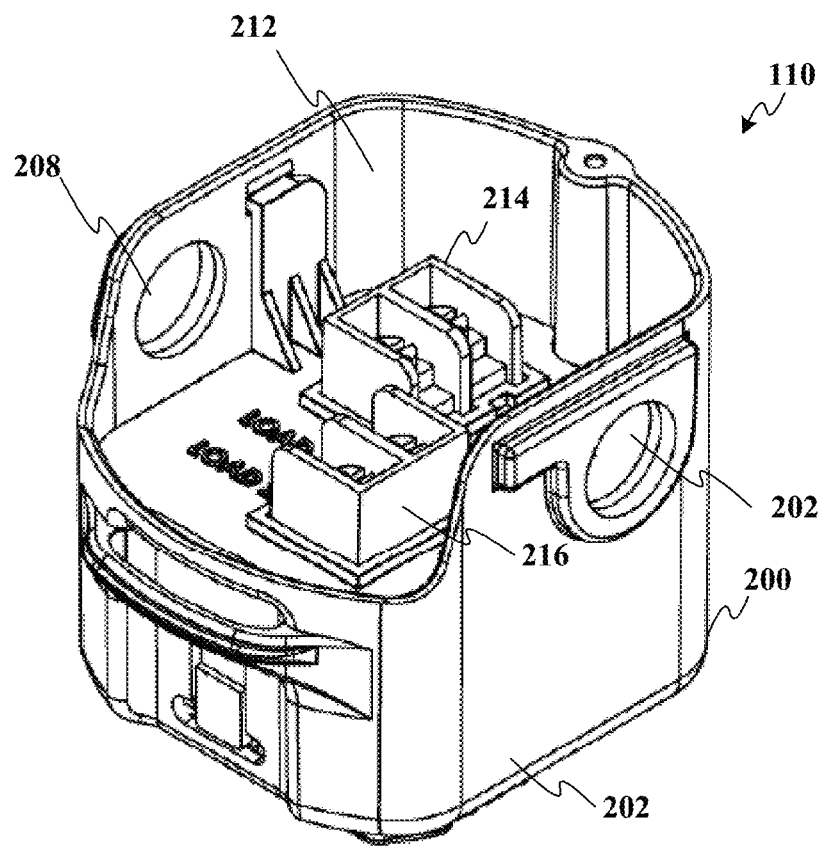
FIG. 5 is a top front right perspective view of the controller of FIG. 2 with a housing cap removed.
Figure 6:
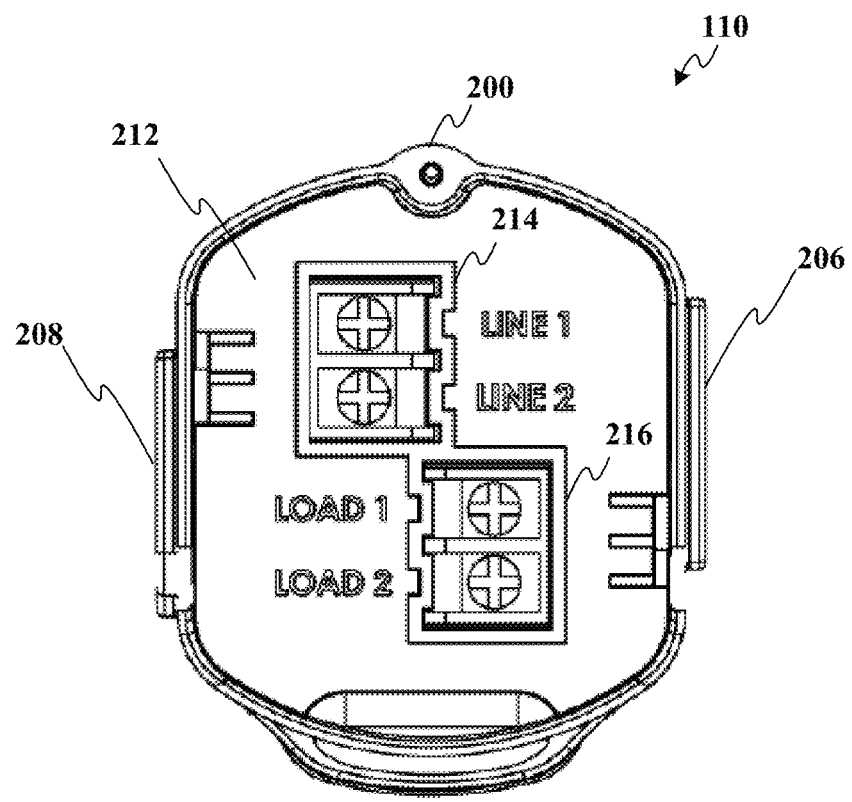
FIG. 6 is a top view of the controller of FIG. 2 with the housing cap removed.

Turning to FIGS. 2-6, illustrated is an exemplary, non-limiting embodiment of controller 110 according to various aspects. As shown in the figures, the controller 110 includes a controller housing 200. In an embodiment, the controller housing 200 includes a housing body 202 and a housing cap 204. The housing cap 204, in some embodiments, covers and protects a wiring compartment 212 (FIGS. 5 and 6). The housing body 202 contains, for example, control and communication electronics and/or a pressure switch.

The housing 200 further includes a first opening 206 (FIG. 2) and a second opening 208 (FIG. 3) positioned on opposing sides of the housing 200. The first and second openings 206 and 208 provide access to the wiring compartment 212 while the housing cap 204 is installed. Wiring may pass through openings 206 and 208. Further, the openings 206 and 208 may facilitate connection with conduit through which the wiring is run. A controller opening 210 (FIG. 4) may be positioned on a bottom of the controller housing 200 in some embodiments. Controller opening 210 may provide access for wires or other connectors to couple with control, communication, and/or pressure switch electronics.

According to an embodiment, wiring compartment 212 may include one or more terminal blocks such as terminal block 214 and terminal block 216. The terminal blocks 214 and 216 provide an externally accessible connection to control electronics within the housing body 202 (e.g. such as a pressure switch). As best shown in FIG. 6, terminal blocks 214 and 216, in an embodiment, enable connection to a high voltage (e.g. greater than or equal to 120 volts) to power the controller 110 and an external device (e.g. a pump). In an embodiment, terminal block 214 connects with incoming line power and terminal block 216 connects with the pump. These connections, in an embodiment, enable controller 110 to operate the pump in accordance with one or more control processes that may selectively switch power on or off to the pump.

Figure 7:
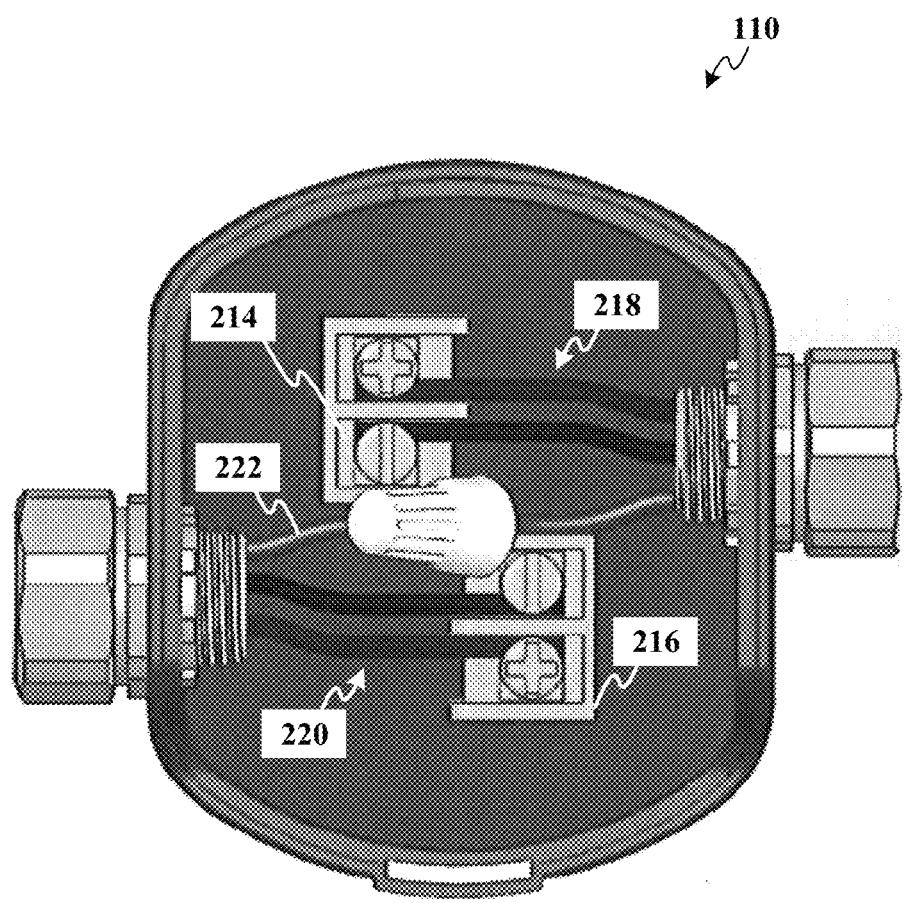
FIG. 7 is a schematic diagram of the controller of FIG. 2 with exemplary wiring in accordance with an aspect.

Turning to FIG. 7, an exemplary, non-limiting schematic diagram of a controller with wiring is depicted. Terminal blocks 214 and 216 provide a metal area where high voltage wiring 218 and 220 is respectively fastened into place with a screw-type fastener. A bare ground wire 222 runs over top and passes through openings 206 and 208.

In some situations, the fastener may loosen or another bare wire may touch some portion of the terminal block during installation or servicing. In these circumstances, the result may be a popped breaker, an electrical shock, and/or damage to system components. The likelihood of wiring inadvertently contacting a terminal block may depend on a layout of the terminal blocks 214 and 216 (e.g. relative placement) and/or on an amount of wiring pushed into the wiring compartment 212.

In view of the above situation, an electrical cover is described herein that is configured to protect terminal blocks (e.g. terminal blocks 214 and 216) from having stray wires entering a connection space. The electrical cover also retains desired wiring within the connection space, such as wiring 218 connected to terminal block 214. Accordingly, the electrical covers protect the device, the user, and the system from potential loose wires.

Figure 8:
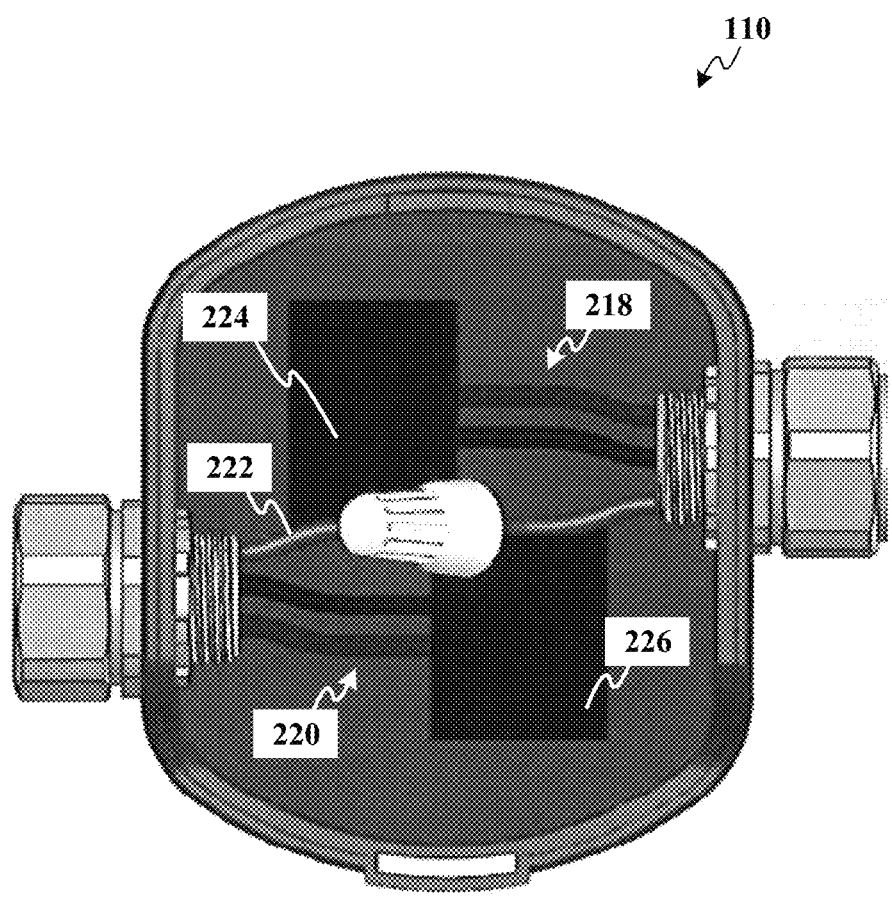
FIG. 8 is a schematic diagram of the controller of FIG. 2 with electrical covers according to various aspects.

Turning to FIG. 8, the schematic diagram of controller 110 includes an least one electrical cover for the terminal blocks. In the embodiment shown in FIG. 8, electrical cover 224 is installed on terminal block 214 and electrical cover 226 is installed on terminal block 216. In some embodiments, the electrical covers 224 and 226 may be a vinyl, rubber, or other electrically insulating material. In another embodiment, electrical covers 224 and 226 are deformable and can be stretched over the terminal blocks. Further, the electrical covers 224 and 226 are resilient and rebound after stretching to fit snugly around sidewalls of the terminal blocks when installed. Thus, the electrical covers 224 and 226, once installed, do not pop off from system movement or vibration.

As shown in FIGS. 7 and 8, a pass-through ground wire 222 is used. The pass-through ground wire 222 can reduce an overall footprint of the device and can streamline a circuit board layout of controller 110. Thus, while separate ground wire connections on the terminal blocks may mitigate a potential for stray wire contacts, the above advantages (e.g. reducing overall footprint and simplifying circuit board layout) are lost. Electrical covers 224 and 226, however, also mitigate the potential for stray wire contacts, like separate connections, but without losing these advantages. Further, the pass-through ground wire 222 may facilitate retaining electrical covers 224 and 226 in place.

In yet another embodiment, electrical covers 224 and 226 may be a monolithic piece. For instance, in devices having multiple terminal blocks, a single electrical cover configured to cover all terminal blocks minimizes a risk of improper installation. Accordingly, the monolithic piece has a shape corresponding to the relative positioning of the terminal blocks. The monolithic embodiment further improves the retaining properties of the ground wire 222.

Figure 9:
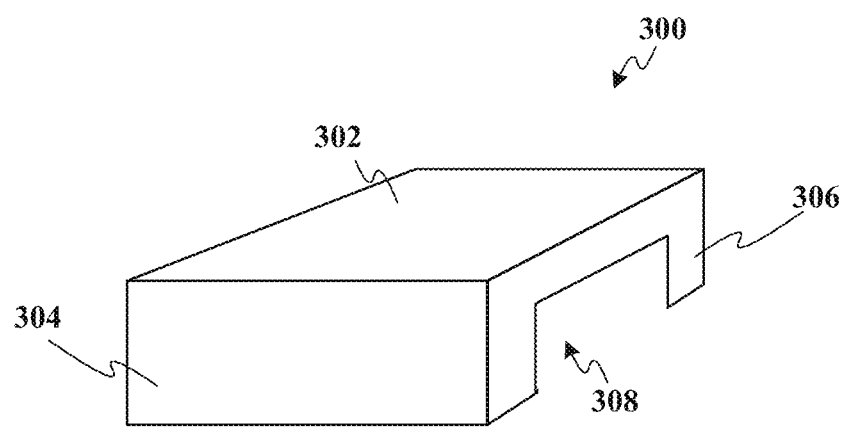
FIG. 9 is an exemplary, non-limiting embodiment of an electrical cover according to various aspects.

Referring now to FIG. 9, an exemplary, non-limiting embodiment of an electrical cover 300 is illustrated. Electrical covers 224 and 226, described above, may be similar to electrical cover 300 shown in FIG. 9. Electrical cover 300 includes a cover surface 302 and a plurality of sidewalls 304 extended downward from the cover surface 302. One sidewall, as shown in FIG. 9, may be a notched sidewall 306 having an opening 308 therein that accommodates wiring connected to a terminal block.

As described above, the electrical cover 300 is formed from a flexible material. In some embodiments, electrical cover 300 may be a vinyl material, a rubber material, or other flexible and electrically-insulating material. That is, if electrical cover 300 is contacted with an exposed wire, the material of electrical cover 300 should be chosen such that an insignificant current would pass through. As utilized herein, an insignificant current is a current low enough to not pose a safety risk to people or equipment, low enough to not damage equipment, and/or low enough to not trip a fuse or circuit breaker.

The electrical cover 300 may be dimensioned in accordance with the terminal block. For instance, an area of cover surface 302 may generally correspond to an area of a footprint of the terminal block. Moreover, a height of sidewalls 304 can substantially correspond to a height of the terminal block. Further, lengths of sidewalls 304 can be respectively established to correspond to the horizontal dimensions of the terminal block.

As described above, electrical cover 300 may be flexible and deformable, yet resilient. Sidewalls 304 may be deflected or stretched outward through an application of a force. The sidewalls 304 rebound to a non-deformed state when the force is removed. Thus, the cover 300 can be flexed to slip over the terminal block. Thereafter, the sidewalls 304 return to a rest state and exert a force against the terminal block to secure cover 300 in place.

As utilized herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the term "exemplary" is intended to mean "serving as an illustration or example of something."

Illustrative embodiments have been described, hereinabove. It will be apparent to those skilled in the art that the above devices and methods may incorporate changes and modifications without departing from the general scope of the claimed subject matter. It is intended to include all such modifications and alterations within the scope of the claimed subject matter. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A terminal block cover, comprising:
a piece of electrically insulating material,
wherein the piece is deformable to slip over the at least two terminal blocks,
wherein the piece covers connection areas of the at least two terminal blocks, and wherein the piece is a monolithic piece shaped in accordance with respective sizes and a relative placement of the at least two terminal blocks, the monolithic piece being configured to attached to all of the at least two terminal blocks.

2. The terminal block cover of claim 1, wherein the piece includes a cover surface and a plurality of sidewalls extending from the cover surface.

3. The terminal block cover of claim 2, wherein the plurality of sidewalls are deflectable outwards through application of a force to enable attachment to the at least two terminal blocks.

4. The terminal block cover of claim 3, wherein the plurality of sidewalls are resilient and rebound to a rest shape after removal of the force.

5. The terminal block cover of claim 4, wherein the plurality of sidewalls exert a retaining force on the at least two terminal blocks in the rest shape to retain the piece in place on the at least two terminal blocks.

6. The terminal block cover of claim 2, wherein at least one sidewall of the plurality of sidewalls includes an opening.

7. The terminal block cover of claim 1, wherein the piece is dimensioned in accordance with the at least two terminal blocks.

8. The terminal block cover of claim 6, wherein the opening receives wiring passing through for connection to the at least two terminal blocks.

9. The terminal block cover of claim 1, wherein the electrically insulating material is one of a vinyl or a rubber.

10. A controller, comprising:
a housing, wherein the housing includes:
a housing body that includes an enclosed compartment containing control and communication electronics, and a wiring compartment; and
a housing cap removably attached to the housing body to enclose the wiring compartment;
at least two terminal blocks positioned within the wiring compartment that respectively provide one or more connection points for wiring, the at least two terminal blocks electrically couples the control and communication electronics within the enclosed compartment to the one or more connection points; and
a cover removably attached to the at least two terminal blocks,
wherein the cover is a monolithic piece shaped in accordance with respective sizes and a relative placement of the at least two terminal blocks, the monolithic piece being configured to attached to all of the at least two terminal blocks.

11. The controller of claim 10, wherein the cover is formed from an electrically insulating material.

12. The controller of claim 10, wherein the cover is deformable to slip over the at least two terminal blocks.

13. The controller of claim 10, wherein the cover surrounds the one or more connection points of the at least two terminal blocks.

14. The controller of claim 10, wherein the cover includes a cover surface and a plurality of sidewalls extending from the cover surface.

15. The controller of claim 14, wherein the plurality of sidewalls are deflectable outwards through application of a force to enable attachment to the at least two terminal blocks.

16. The controller of claim 15, wherein the plurality of sidewalls are resilient and rebound to a rest shape after removal of the force.

17. The controller of claim 16, wherein the plurality of sidewalls exert a retaining force on the at least two terminal blocks in the rest shape to retain the piece in place on the at least two terminal blocks.

18. The controller of claim 10, wherein the housing body includes a pair of openings on opposed sides of the wiring compartment to receive wiring, wherein the wiring includes wiring for a line power, wiring for a load, and a pass-through ground wire,
wherein the cover electrically insulates the at least two terminal blocks from the pass-through ground wire.

* * * * *